United States Patent
Ma

(10) Patent No.: US 8,946,711 B2
(45) Date of Patent: Feb. 3, 2015

(54) ORGANIC LIGHT-EMITTING DISPLAY DEVICE INCLUDING BLACK MATRIX-CONTAINING NEUTRAL DENSITY FILM

(75) Inventor: Jang-Seok Ma, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 13/368,271

(22) Filed: Feb. 7, 2012

(65) Prior Publication Data

US 2012/0319122 A1 Dec. 20, 2012

(30) Foreign Application Priority Data

Jun. 17, 2011 (KR) .................. 10-2011-0059172

(51) Int. Cl.
*H01L 29/04* (2006.01)
*H01L 51/52* (2006.01)

(52) U.S. Cl.
CPC ................................ *H01L 51/5284* (2013.01)
USPC ................... 257/59; 257/72; 257/88; 257/98; 257/40; 257/437; 257/E51.001; 257/E51.026; 438/82; 438/116; 438/725; 438/780

(58) Field of Classification Search
USPC ...................... 257/79–103, 40, 437, E51.001, 257/E51.018–E51.022, E51.026, 59, 72, 257/725, 780, 116
See application file for complete search history.

(56) References Cited

U.S. PATENT DOCUMENTS

| 6,657,387 B1 | 12/2003 | Yoo |
| 8,629,614 B2 * | 1/2014 | Nakamura et al. ............ 313/512 |
| 2005/0248929 A1 * | 11/2005 | Kawamura et al. ............ 362/84 |
| 2010/0290143 A1 | 11/2010 | Kim et al. |
| 2011/0175118 A1 * | 7/2011 | Hori et al. ....................... 257/89 |

FOREIGN PATENT DOCUMENTS

| KR | 2000-0067640 | 11/2000 |
| KR | 10-2004-0049459 A | 6/2004 |
| KR | 10-2008-0049955 A | 6/2008 |
| KR | 10-2009-0039545 A | 4/2009 |
| KR | 10-2010-0008155 A | 1/2010 |
| KR | 10-2010-0123973 | 11/2010 |

* cited by examiner

*Primary Examiner* — David Vu
*Assistant Examiner* — Cuong B Nguyen
(74) *Attorney, Agent, or Firm* — Christie, Parker & Hales, LLP

(57) ABSTRACT

An organic light-emitting display device including: a substrate; a plurality of pixels each including a first electrode, a second electrode, and an organic emission layer interposed between the first electrode and the second electrode; and a black matrix-containing neutral density (ND) film formed in a direction in which light is emitted from the plurality of pixels.

17 Claims, 7 Drawing Sheets ated Korean Patent Application No. 10-2011-0059172, filed on Jun. 17, 2011, in the Korean Intellectual Property Office, the disclosure of which is incorporated herein in its entirety by reference.

BACKGROUND

1. Field

The following description relates to an organic light-emitting display device in which the reflection of external light is reduced or prevented, and more particularly, to an organic light-emitting display device including a black matrix-containing neutral density (ND) film by which the reflection of external light is substantially or fully suppressed, and light emitted from pixels is substantially or fully transmitted, and thus the organic light-emitting display device has enhanced visibility under external light.

2. Description of Related Art

Organic light-emitting display devices, which are self-emission display devices, have a wide viewing angle, high contrast ratio, quick response time, high luminance, and low driving voltage, and can also display multiple color images.

Conventional organic light-emitting devices may have a structure in which an anode is formed on a substrate, and a hole transport layer (HTL), an emission layer (EML), an electron transport layer (ETL), and a cathode are sequentially formed on the anode. The HTL, the EML, and the ETL are generally formed of an organic compound, and these three layers are collectively referred to as "organic emission layer." When a voltage is applied to an anode and a cathode, holes injected from the anode migrate to the emission layer via the HTL, and electrons injected from the cathode migrate to the emission layer via the ETL. Carriers such as holes and electrons are recombined with each other in the emission layer to generate exitons, and the exitons are converted from an excited state to a ground state to emit light.

Organic light-emitting display devices are divided into a top-emission type and a bottom-emission type according to a direction in which pixels composed of organic light-emitting devices emit light. A bottom-emission type organic light-emitting display device has a light-emitting region and a non-light emitting region. The light-emitting region has a structure in which an anode, an organic emission layer, and a cathode are sequentially stacked on a substrate, and the non-light emitting region has a structure in which a thin film transistor (TFT) and metal wires are formed. The cathode of the light-emitting region, and the TFT and metal wires of the non-light emitting region have high reflectability, and thus, as external light becomes brighter, the reflection of external light increases. Consequently, a reflected image overlaps with a desired image, and thus it is difficult to realize clear images.

Such reflection of external light may be quantitatively evaluated by measuring ambient contrast ratio (ACR). ACR is defined by the equation below, and the black luminance ($L_{black(off\text{-}state)}$), of an organic light-emitting device is approximated to be 0, thereby inducing a simple formula:

$$ACR = (L_{white(on\text{-}state)} + R \times L_{ambient})/(L_{black(off\text{-}state)} + R \times L_{ambient})$$

$$\approx 1 + (L_{white(on\text{-}state)})/(R \times L_{ambient})$$

$$\approx 1 + (\text{luminance/reflected luminance})$$

It is assumed that an external light source is Lambertian-reflected from a surface of an organic light-emitting display device. The illuminance ($L_{Ambient}$, lux) of the external light source is converted to luminance (cd/m²). When the luminance ($L_{White(on\text{-}state)}$) of the organic light-emitting display device is 200 nit and the reflectance of an organic light-emitting diode is 5% at 150 lux, which is illumination of indoor lamps, ACR is calculated to be about 85. This ACR value is a satisfactory value, and thus there are no problems in displaying images. However, an average reflectance by reflection of a cathode, and by reflection of TFTs and/or metal wires of a general organic light-emitting display device, is about 65%. Thus, when an aspect ratio of a light-emitting region is about 30% and the reflectance thereof is about 60%, and an aspect ratio of a TFT/metal wire region is 70% and the reflectance thereof is about 70%, the average reflectance is 67%. When the average reflectance is about 65%, ACR is calculated to be about 19 at a luminance of 550 nit and an illumination of 150 lux, and an actual measurement value thereof is about 14. Under these conditions, it is difficult to properly view images displayed in an organic light-emitting display device.

To address these problems due to the reflection of external light, a circularly polarized film (e.g., hard coat surface-treated circularly polarized film) or a color filter (e.g., an organic light-emitting diode having a resonance structure and a color filter) is used to reduce the reflectance of an organic light-emitting display device to about 5% to 7%. However, the use of the circularly polarized film requires a protective film, a linear polarized film, and a λ/4 phase difference film, and at least two sheets of protective films and phase difference films are used. In addition, the transmittance of light by an absorption-type linearly polarized film is less than 50%, and thus the luminous efficiency of an organic light-emitting display device is reduced. Also, light of an organic light-emitting display device is polarized light, and thus, when three-dimensional (3D) images are viewed in a passive glasses manner, transmittance characteristics due to viewing angles may be deteriorated. On the other hand, when manufacturing a bottom-emission type organic light-emitting display device and when the color filter is used, a black matrix and the color filter need manufacturing prior to a manufacturing process of a TFT, and thus the manufacturing processes are more complicated than when the circularly polarized film is used. In addition, in the bottom-emission type organic light-emitting display device, when Cr/CrOx or an organic CF material is subjected to a high-temperature manufacturing process of a TFT, either the properties of the material are deteriorated or the material may act as an outgassing source.

SUMMARY

Aspects of embodiments of the present invention are directed toward an organic light-emitting display device including a black matrix-containing ND film that includes a first region (light-emitting region) corresponding to a plurality of pixels and a second region (non-light emitting region), wherein the first region includes a dye, thereby adjusting transmittance, and the second region includes a black matrix, thereby reducing transmittance, whereby the reflection of external light is suppressed.

According to an embodiment of the present invention, there is provided an organic light-emitting display device including: a substrate; a plurality of pixels each including a first electrode, a second electrode, and an organic emission layer interposed between the first electrode and the second electrode; and a black matrix-containing neutral density (ND) film formed in a direction in which light is emitted from the plurality of pixels and including first regions respectively corresponding to the plurality of pixels and second regions, wherein each of the second regions includes a black matrix.

The black matrix may be formed to correspond to each of the second regions.

The black matrix may be formed via patterning in each of the second regions.

A concave shape formed in each of the second regions may be filled with the black matrix.

The black matrix may have a thickness of from about 100 to about 200 μm.

The black matrix may include an organic material.

The black matrix may include carbon black, a dye, or a resin.

Each of the second regions may be a non-light emitting region corresponding to a thin film transistor (TFT) and a metal wire.

The first regions and the second regions of the black matrix-containing ND film may be arranged alternately with respect to each other.

The organic light-emitting display device may be a bottom-emission type in which light emitted from the plurality of pixels is emitted towards the substrate.

The organic light-emitting display device may be a top-emission type in which light emitted from the plurality of pixels is emitted in the opposite direction of the substrate.

The first regions may transmit light of a certain color emitted from the plurality of pixels and have an optical transmittance of from about 30% to about 70%.

The second regions may have an optical transmittance of from about 1% to about 10%.

The black matrix-containing ND film may include at least one selected from the group consisting of polycarbonate (PC), polyethylene terephthalate (PET), amorphous polyethylene terephthalate (APET), polypropylene terephthalate (PPT), polynaphthalene terephthalate (PEN), polyethylene terephthalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polymethyl methacrylate (PMMA), polyimide (PI), polyarylate (PAR), polyethersulfone (PES), polyetherimide (PEI), a silicon resin, a fluorine resin, and an epoxy resin.

The black matrix-containing ND film may include from about 10 to about 50 parts by weight of a dye based on 1 part by weight of a binder.

The organic light-emitting display device may further include a surface treatment layer formed on the black matrix-containing ND film by performing an anti reflector (AR) coating treatment.

Each of the first regions may include a surface treatment layer, a base resin layer, and a dye-containing layer.

Each of the second regions may include a surface treatment layer, a base resin layer including a black matrix, and a dye-containing layer.

According to another embodiment of the present invention, there is provided a method of preparing a black matrix-containing ND film, the method including: patterning a second region other than a first region that corresponds to a pixel, wherein the first and second regions constitute an ND film; coating a material for forming a black matrix in the second region; and planarizing the second region by using a pressurizing device.

According to another embodiment of the present invention, there is provided a black matrix-containing ND film prepared according to the method described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, exemplary embodiments of the present invention will be described in detail with reference to the accompanying drawings.

Figure 1:
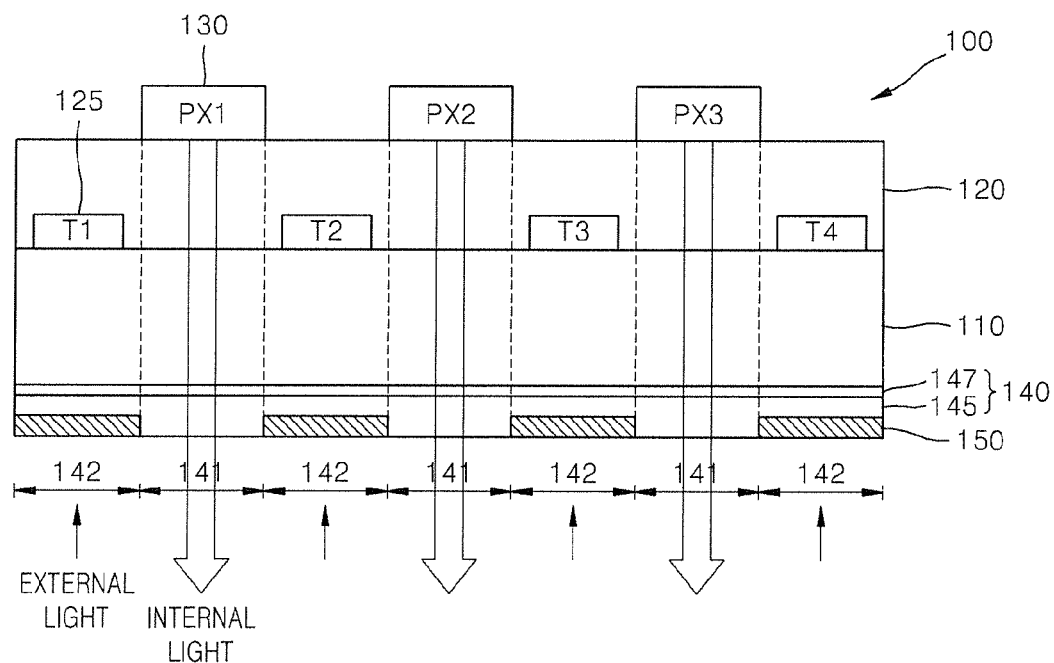
FIG. 1 is a schematic cross-sectional view of a bottom-emission type organic light-emitting display device according to an embodiment.

FIG. 1 is a schematic cross-sectional view of a bottom-emission type organic light-emitting display device 100 according to an embodiment.

Referring to FIG. 1, the organic light-emitting display device 100 includes a substrate 110, a thin film transistor (TFT) layer 120 including a plurality of TFTs 125, a plurality of pixels 130, and a neutral density (ND) film 140 including black matrixes 150.

The substrate 110 may be formed of various suitable materials, such as glass and/or plastic. The organic light-emitting display device 100 is a bottom-emission type in which light is emitted in a direction of the substrate 110, and thus the substrate 110 may be formed of a transparent material.

The TFT layer 120 includes the plurality of TFTs 125. Although not illustrated in FIG. 1, the plurality of TFTs 125 may be respectively connected electrically to the plurality of pixels 130. In addition, in FIG. 1, it is illustrated that the TFT layer 120 includes only the plurality of TFTs 125; however, the element of the TFT layer 120 is not limited thereto. That is, the TFT layer 120 may further include any kind of wires. In addition, although not illustrated in FIG. 1, the TFT layer 120 may further include a plurality of insulating layers that insulate between wires.

The plurality of pixels 130 are disposed on the TFT layer 120. The plurality of pixels 130 are arranged apart from each other at a set or predetermined pixel pitch between adjacent pixels. In FIG. 1, it is illustrated that a pixel pitch between a first pixel (PX1) and a second pixel (PX2) is the same as a pixel pitch between PX2 and a third pixel (PX3); however, the present invention is not limited thereto. That is, each pixel pitch between pixels may be different from each other.

The ND film 140 including the black matrix 150 is arranged on the side of the substrate 110. The ND film 140 is arranged in a direction in which internal light emitted from the plurality of pixels 130 is emitted. The organic light-emitting display device 100 is a bottom-emission type, and thus the ND film 140 may be disposed below the substrate 110. The ND film 140 includes first regions 141 (light-emitting region) respectively corresponding to the plurality of pixels 130 from which internal light is emitted and second regions 142 (non-light emitting region) including the black matrix 150. The second regions 142 may be disposed corresponding to the TFTs 125 and metal wires.

The ND film 140 includes a base resin layer 145 and a dye-containing layer 147. The base resin layer 145 may be formed of at least one selected from the group consisting of polycarbonate (PC), polyethylene terephthalate (PET), amorphous polyethylene terephthalate (APET), polypropylene terephthalate (PPT), polynaphthalene terephthalate (PEN), polyethylene terephthalate glycerol (PETG), polycyclohexylene dimethylene terephthalate (PCTG), denatured triacetyl cellulose (TAO), cycloolefin polymer (COP), cycloolefin copolymer (COC), dicyclopentadiene polymer (DCPD), cyclopentadiene polymer (CPD), polymethyl methacrylate (PMMA), polyimide (PI), polyarylate (PAR), polyethersulfone (PES), polyetherimide (PEI), a silicon resin, a fluorine resin, and an epoxy resin. The base resin layer 145 may be formed of a transparent optical isotropic or anisotropic sheet; however, the present invention is not limited thereto. The dye-containing layer 147 includes a binder and a dye. The binder attaches the ND film 140 to the substrate 110, and the dye adjusts the transmittance of the first region 141 corresponding to the light-emitting region. The dye may be basically a red, blue, or green dye, and the type, amount, and chromaticity of the dye may be variously adjusted to absorb colors of a desired light source or white light source. For example, the dye may be, but is not limited to, at least one selected from the group consisting of Red 138 (refer to the following formula), Green 3 (refer to the following formula), and Blue 97 (refer to the following formula).

Acid Red 138:
Disodium 5-(acetylamino)-3-[(4-dodecylphenyl)azo]-4-hydroxynaphthalene-2,7-disulphonate

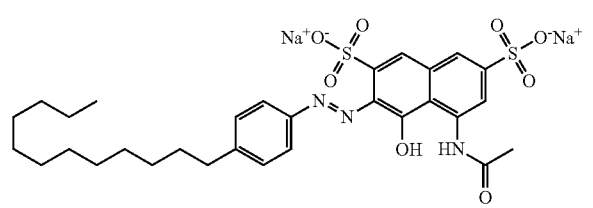

Solvent Green 3:
1,4-bis(p-tolylamino)anthraquinone

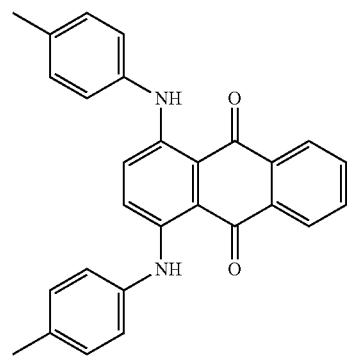 [SMILES: Cc1ccc(Nc2ccc(Nc3ccc(C)cc3)c3c2C(=O)c2ccccc2C3=O)cc1]

Solvent Blue 97:
1,4-Bis[(2,6-diethyl-4-methylphenyl)amino]anthraquinone); 1,4-Bis(2,6-diethyl-4-methylanilino)anthraquinone); or (N,N'-Bis(2,6-diethyl-4-methylphenyl)-1,4-diaminoanthraquinone)

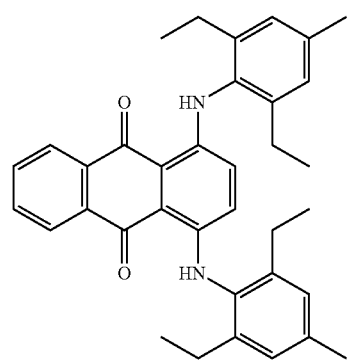 [SMILES: CCc1cc(C)cc(CC)c1Nc1ccc(Nc2c(CC)cc(C)cc2CC)c2c1C(=O)c1ccccc1C2=O]

The amount of the dye mixed with the binder may be in the range of about 10 to about 50 parts by weight based on 1 part by weight of the binder. When the amount of the dye is within this range, the first region 141 may have a satisfactory transmittance.

The black matrixes 150 are included in concave shapes formed in the ND film 140, thereby reducing reflection of light that may be caused by reflection by the TFTs and metal wires. If the ND film 140 does not include the black matrix 150, reflectance by the TFTs and metal wires is about 65%. Considering that an aspect ratio of the non-light emitting region is about 70%, the organic light-emitting display device has a very high reflectance, i.e., about 67%. A black matrix has a very low reflectance, and thus, when the non-light emitting region includes such a black matrix, the reflectance by the TFTs and metal wires is about 5%. Considering that an aspect ratio of the non-light emitting region is about 70%, the reflectance of the organic light-emitting display device is reduced to about 21%.

The black matrix 150 may be disposed corresponding to the second region 142. In this case, the transmitting of the internal light may not be interrupted in the light-emitting region, and the reflection of external light may be effectively reduced or prevented in the non-light emitting region.

The black matrixes 150 may be formed by patterning in the second region 142. In this case, a separate process of attaching the black matrixes 150 to a panel of the organic light-emitting display device is not required. When the black matrixes 150 are formed by patterning in the second regions 142, a possibility of contamination by outgassing in the material of the black matrix 150 decreases, degradation of the TFT layer 120 caused by a high-temperature process is reduced or prevented, and defects, such as crystallization of $SiO_2$ due to a thickness gap of the black matrix 150, are reduced or prevented.

For example, the black matrixes 150 may be formed to fill concave shapes formed by performing a patterning process of a black matrix on the second regions 142.

The black matrix 150 may have a thickness in the range of about 100 to about 200 μm. In one embodiment, when the thickness of the black matrix 150 is within this range, reflection of light is effectively reduced, outgassing is decreased, and defects caused by a thickness gap of the black matrix 150 is prevented.

The black matrix 150 may include an organic material. The black matrix 150 is formed corresponding to each of the second regions 142 corresponding to TFTs and wire regions, and thus may be formed of a material having a low reflectance. Meanwhile, $Cr/CrO_X$ has a low reflectance, but the use of this material for forming a black matrix is not desired (or banned) due to environmental concerns (or regulations). The black matrixes 150 are formed by patterning on the second regions 142 of the ND film, and a harsh process such as a high-temperature process of TFT is not required, and thus the black matrix 150 may be formed of an organic material such as carbon black.

The black matrix 150 may be carbon black, a dye, or a resin.

The ND film 140 including the black matrix 150 may have a structure in which the first regions 141 and the second regions 142 are arranged alternately with respect to each other. The first regions 141 respectively correspond to the plurality of pixels 130, and the second regions 142 respectively correspond to the plurality of TFTs 125/metal wires.

Figure 2:
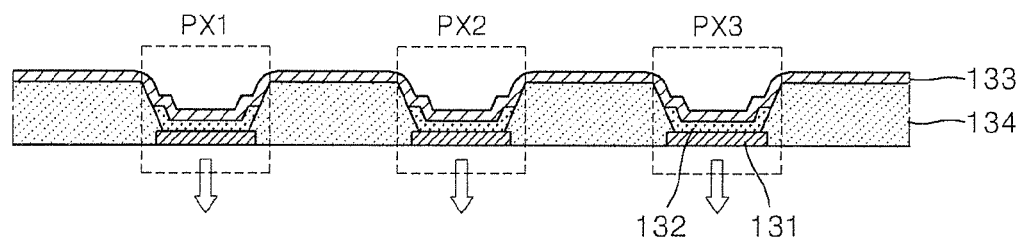
FIG. 2 is a cross-sectional view particularly illustrating a pixel unit of FIG. 1, according to an embodiment.

FIG. 2 is a cross-sectional view particularly illustrating a pixel unit of FIG. 1, according to an embodiment.

Referring to FIG. 2, each of the pixels PX1, PX2 and PX3 includes a first electrode 131, a second electrode 133, and an organic emission layer 132 interposed between the first electrode 131 and the second electrode 133.

When a voltage is applied to the first electrode 131 and the second electrode 133, electrons and holes respectively injected from the first electrode 131 and the second electrode 133 are combined with each other in the organic emission layer 132 to generate excitons, and light is emitted from the organic emission layer 132 by the excitons.

The organic light-emitting display device 100 is a bottom-emission type in which light emitted from the organic emission layer 132 is emitted towards the substrate 110. Thus, the first electrode 131 may be a transparent electrode, and the second electrode 133 may be a reflection electrode. The first electrode 131 may be formed of a transparent conductive material such as ITO, IZO, ZnO, or $In_2O_3$, and the second electrode 133 may include a reflection film formed of at least one material selected from the group consisting of Ag, Mg, Al, Pt, Pd, Au, Ni, Nd, Ir, and Cr and a transparent film formed of ITO, IZO, ZnO, or $In_2O_3$.

The organic emission layer 132 may be formed of a small molecular organic material or a polymer organic material. When the organic emission layer 132 is formed of the small molecular organic material, a single or composite structure including a hole injection layer (HIL), a hole transport layer (HTL), an electron transport layer (ETL), an electron injection layer (EIL), and the like with the organic emission layer 132 therebetween, may be formed. The organic material that may be used to form the organic emission layer 132 may be copper phthalocyanine (CuPc), N,N'-di(naphthalene-1-yl)-N,N'-diphenyl-benzidine (NPB), or tris-8-hydroxyquinoline aluminum ($Alq_3$). When the organic emission layer 132 is formed of the polymer organic material, a hole injection layer (HIL) may further be formed. In this regard, the HIL may be formed of PEDOT, and the organic emission layer 132 may be formed of a polymer organic material such as polyphenylenevinylene (PPV) or polyfluorene. A pixel defining layer 134 may be formed between the plurality of pixels PX1, PX2 and PX3 to cover edges of the first electrode 131 and to define pixels each including the organic emission layer 132 formed in an opening formed on the first electrode 131.

Referring back to FIGS. 1 and 2, in the bottom-emission type organic light-emitting display device 100, light emitted from the organic emission layer 132 is transmitted through the first electrode 131, the TFT layer 120, the substrate 110, and the ND film 140, whereby images are displayed in the direction of the substrate 110.

In this regard, external light such as sunlight or a fluorescent lamp is transmitted through the substrate 110, thereby being incident into the organic light-emitting display device 100. The external light incident into the organic light-emitting display device 100 is reflected by the TFTs 125 or any kind of wires of the TFT layer 120, or is reflected by the first electrode 131 or the second electrode 133, thereby being emitted back towards the substrate 110. The reflected external light acts as noise that adversely affects light emitted from the organic emission layer 132 for displaying images, and thus the visibility of the displayed images may be reduced.

The organic light-emitting display device 100 according to the present embodiment includes the ND film 140 including the black matrixes 150, disposed below the substrate 110, and thus the reflection of external light may be reduced.

A patterning process is performed on the second regions 142 of the ND film 140, and concave shapes formed on the second regions 142 are filled with the black matrixes 150. Through this process, the ND film 140 including the black matrixes 150 may be formed. The ND film 140 including the black matrixes 150 includes the first regions 141 each including the base resin layer 145 and the dye-containing layer 147 and the second regions 142 each including the base resin layer 145 including the black matrix 150 and the dye-containing layer 147. In the first regions 141, the transmittance of the light-emitting region may be satisfactorily adjusted by adjusting the amount of the dye in the dye-containing layer 147. In the second regions 142, the reflectance of the non-light emitting region may be adjusted to a low level by using the black matrixes 150. Thus, in the organic light-emitting display device 100 including the ND film 140 including the black matrixes 150, the reflection of external light incident from outside is reduced or suppressed and loss of light emitted outside from the plurality of pixels 130 is minimized. In addition, the light emitted outside from the organic light-emitting display device 100 including the ND film 140 including the black matrixes 150 is non-polarized light, and thus 3D images may be viewed very well.

For example, when the reflectance of the first region 141 of the ND film 140 is 60% and the reflectance of the second region 142 thereof by the TFTs 125 and metal wires is about 70%, the optical transmittance is adjusted to be about 45% by including an appropriate kind and amount of dye in the ND film 140 and the optical transmittance is adjusted to be about 5% by including the black matrixes 150 in the second regions 142. Consequently, the reflectance of the organic light-emitting display device 100 including the ND film 140 including the black matrixes 150 becomes about 4%. In this case, a CR value becomes 85 or less, and thus the organic light-emitting display device 100 has high or excellent visibility.

The first region 141 transmits light of a certain color emitted from the plurality of pixels 130, and the optical transmittance thereof may be in the range of about 30% to about 70%. When the optical transmittance of the first region 141 is within this range, internal light may be satisfactorily obtained.

The optical transmittance of the second region 142 may be in the range of about 1% to about 10%. When the optical transmittance thereof is within this range, the reflection of external light may be satisfactorily achieved.

Figure 3:
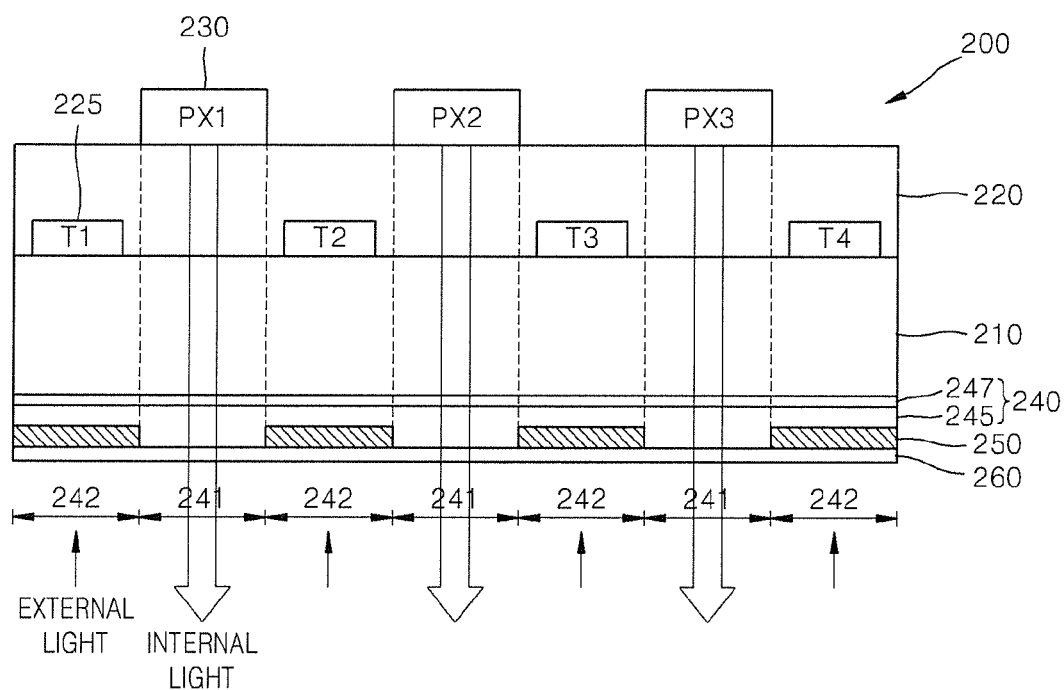
FIG. 3 is a schematic cross-sectional view illustrating a bottom-emission type organic light-emitting display device according to another embodiment.

FIG. 3 is a schematic cross-sectional view illustrating a bottom-emission type organic light-emitting display device 200 according to another embodiment.

Referring to FIG. 3, the organic light-emitting display device 200 includes a substrate 210, a TFT layer 220 including a plurality of TFTs 225, a plurality of pixels 230, an ND film 240 including black matrixes 250, and a surface treatment layer 260.

The substrate 210 may be formed of various suitable materials such as glass and/or plastic. The organic light-emitting display device 200 is a bottom-emission type, and thus the substrate 210 is formed of a transparent material.

The TFT layer 220 includes the plurality of TFTs 225. The plurality of TFTs 225 may be respectively connected electrically to the plurality of pixels 230. However, the constitution of the TFT layer 220 is not limited to the above example.

The plurality of pixels 230 is formed on the TFT layer 220.

The ND film 240 including the black matrixes 250 is disposed in a direction of the substrate 210. The ND film 240 is formed in a direction in which internal light emitted from the plurality of pixels 230 is emitted. The organic light-emitting display device 200 is a bottom-emission type, and thus the ND film 240 may be formed below the substrate 210. The ND film 240 includes first regions 241 (light-emitting region) respectively corresponding to the plurality of pixels 230 and second regions 242 (non-light emitting region) each including the black matrix 250. The second regions 242 may be respectively formed corresponding to the TFTs 225 and metal wires.

The ND film 240 includes a base resin layer 245 and a dye-containing layer 247. A material for forming the base resin layer 245 is the same as the material of the base resin layer 145 as described above. The dye-containing layer 247 includes a binder and a dye. In particular, the dye adjusts the transmittance of the first region 241 corresponding to the light-emitting region. The amount of the dye mixed with the binder may be in the range of about 10 to about 50 parts by weight based on 1 part by weight of the binder. In one embodiment, when the amount of the dye is within this range, the first region 241 has a satisfactory transmittance.

The black matrixes 250 are included in concave shapes formed in the ND film 240, thereby reducing reflection of light that may be caused by reflection by the TFTs 225 and metal wires. A black matrix has a very low reflectance, and thus, when the non-light emitting region includes such a black matrix, the reflectance by the TFTs 225 and metal wires may be about 5%.

The black matrixes 250 may be respectively formed corresponding to the second regions 242. In this case, the transmitting of internal light in the light-emitting region may not be interrupted and the reflection of external light in the non-light emitting region may be effectively prevented.

The black matrixes 250 may be formed by patterning in the second regions 242. In this case, a separate process of attaching the black matrixes 250 to a panel of the organic light-emitting display device is not required. When the black matrixes 250 are formed by patterning in the second regions 242, a possibility of contamination by outgassing in the material of the black matrix 250 decreases, degradation of the TFT layer 220 caused by a high-temperature process is reduced or prevented, and defects, such as crystallization of $SiO_2$ due to a thickness gap of the black matrix 250, are reduced or prevented.

For example, the black matrixes 250 may be formed to fill concave shapes formed by performing a patterning process of a black matrix on the second regions 242.

The black matrix 250 may have a thickness in the range of about 100 to about 200 μm. In one embodiment, when the thickness of the black matrix 250 is within this range, reflection of light is effectively prevented, outgassing is decreased, and defects caused by a thickness gap of the black matrix 250 are prevented.

The black matrix 250 may include an organic material. The black matrix 250 is formed corresponding to each of the second regions 242 corresponding to TFTs and wire regions, and thus may be formed of a material having a low reflectance. For example, the black matrix 250 may be formed of an organic material such as carbon black. Examples of the organic material include carbon black, a dye, and a resin.

The ND film 240 including the black matrixes 250 may have a structure in which the first regions 241 and the second regions 242 are arranged alternately with respect to each other. The first regions 241 respectively correspond to the plurality of pixels 230, and the second regions 242 respectively correspond to the plurality of TFTs 225/metal wires.

The surface treatment layer 260 is formed by surface-treating the ND film 240 to reduce or prevent reflection of light. Examples of the surface treatment include anti reflector (AR) coating treatment and anti glare (AG) coating treatment.

Figure 4:
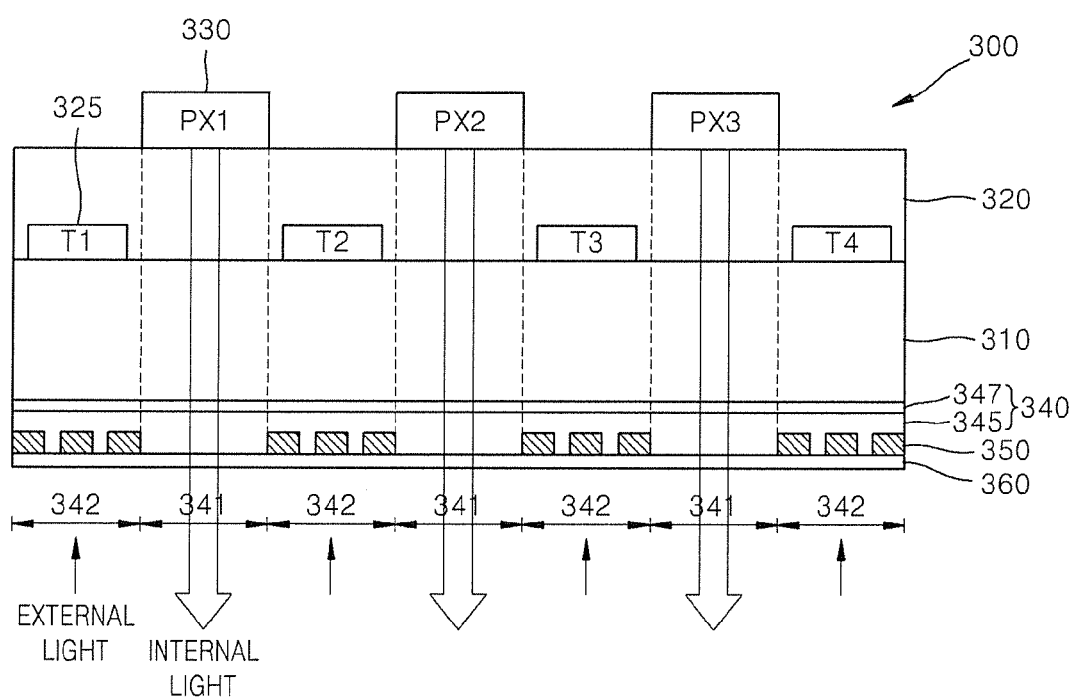
FIG. 4 is a schematic cross-sectional view illustrating a bottom-emission type organic light-emitting display device according to another embodiment.

FIG. 4 is a schematic cross-sectional view illustrating a bottom-emission type organic light-emitting display device 300 according to another embodiment.

Referring to FIG. 4, the organic light-emitting display device 300 includes a substrate 310, a TFT layer 320 including a plurality of TFTs 325, a plurality of pixels 330, an ND film 340 including black matrixes 350, and a surface treatment layer 360.

In the present embodiment, the black matrix 350 may be sub-divided and formed in each of a plurality of second regions 342. The black matrix 350 may also be formed in each of the second regions 342 in a single whole form.

A patterning process is performed on the second regions 342 of the ND film 340, and concave shapes formed in the second regions 342 are filled with the black matrixes 350. Through this process, the ND film 340 including the black matrixes 350 may be formed. The ND film 340 including the black matrixes 350 includes the first regions 341 each including a base resin layer 345 and a dye-containing layer 347 and the second regions 342 each including the base resin layer 345 including the black matrixes 350 and the dye-containing layer 347. In the first regions 341, the transmittance of the light-emitting region may be satisfactorily adjusted by adjusting the amount of the dye in the dye-containing layer 347. In the second regions 342, the reflectance of the non-light emitting region may be adjusted to a low level by using the black matrixes 350.

Figure 5:
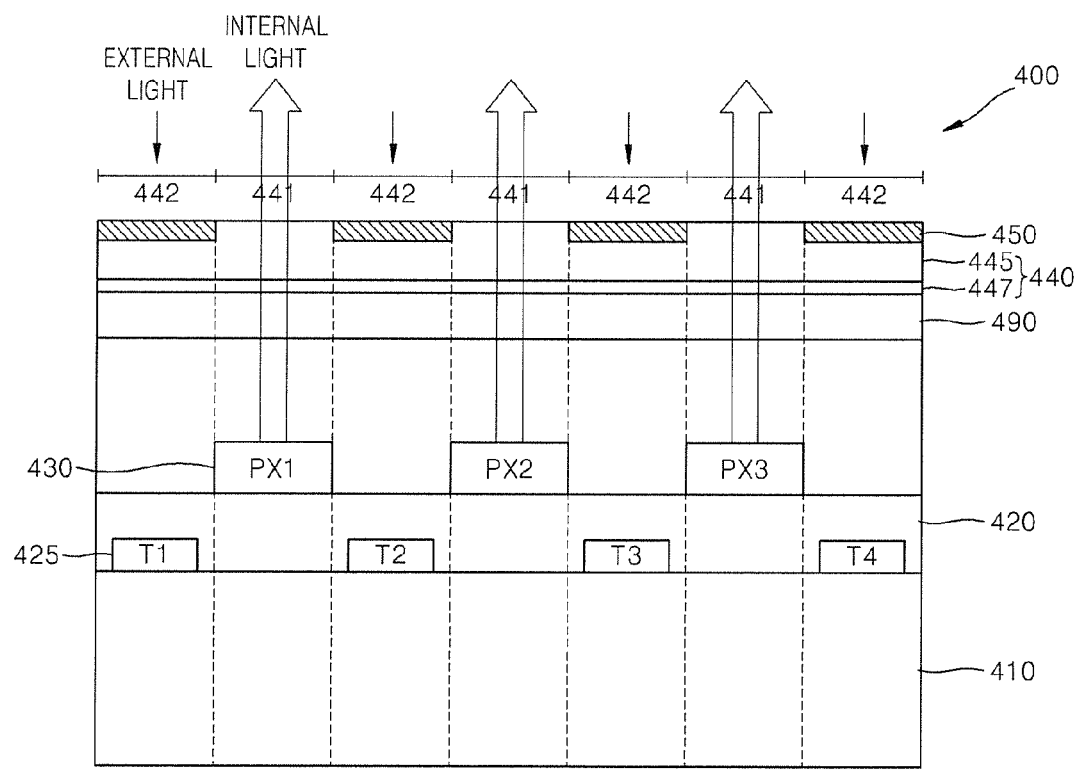
FIG. 5 is a schematic cross-sectional view illustrating a top-emission type organic light-emitting display device according to another embodiment.

FIG. 5 is a schematic cross-sectional view illustrating a top-emission type organic light-emitting display device 400 according to another embodiment.

Referring to FIG. 5, the organic light-emitting display device 400 includes a substrate 410, a TFT layer 420 including a plurality of TFTs 425, a plurality of pixels 430, an encapsulation substrate 490, and an ND film 440 including black matrixes 450.

The substrate 410 may be formed of various suitable materials such as glass and/or plastic. The organic light-emitting display device 400 is a top-emission type in which light is emitted in the opposite direction of the substrate 410, and thus the substrate 410 may not necessarily be transparent.

The TFT layer 420 includes the plurality of TFTs 425. The plurality of TFTs 425 may be respectively connected electrically to the plurality of pixels 430. In addition, in FIG. 5, it is illustrated that the TFT layer 420 includes only the plurality of TFTs 425; however, the element of the TFT layer 420 is not limited thereto. In addition, although not illustrated in FIG. 5, the TFT layer 420 may further include a plurality of insulating layers that insulate between wires.

The plurality of pixels 430 is disposed on the TFT layer 420. The plurality of pixels 430 are arranged apart from each other at a set or predetermined pixel pitch between adjacent pixels. Each pixel pitch between adjacent pixels may be the same as or different from each other.

The encapsulation substrate 490 may be formed on the plurality of pixels 430 to protect the pixels 430. The encapsulation substrate 490 is closely attached to the substrate 410 to protect the plurality of pixels 430 and a driving circuit (DC) unit. Although not particularly illustrated in FIG. 5, a main body of the substrate 410 and the encapsulation substrate 490 are closely attached to each other by using a sealant formed along edges of the encapsulation substrate 490. The encapsulation substrate 490 may be a transparent insulating substrate formed of glass, quartz, ceramic, and/or plastic. The encapsulation substrate 490 may be disposed apart from the plurality of pixels 430. An air layer may be interposed between the encapsulation substrate 490 and the plurality of pixels 430.

The ND film 440 including the black matrixes 450 is formed on a side of the encapsulation substrate 490. The ND film 440 is disposed in a direction in which internal light emitted from the plurality of pixels 430 is emitted. In the present embodiment, the organic light-emitting display device 400 is a top-emission type, and thus the ND film 440 may be disposed in the opposite direction of the substrate 410. For example, the ND film 440 may be disposed on the encapsulation substrate 490. The ND film 440 includes first regions 441 (light-emitting region) corresponding to the plurality of pixels 430 from which internal light is emitted and second regions 442 (non-light emitting region) each including the black matrix 450. The second regions 442 may be formed respectively corresponding to the TFTs 425 and metal wires.

The ND film 440 includes a base resin layer 445 and a dye-containing layer 447. A detailed description of the base resin layer 445 and the dye-containing layer 447 has already been provided above.

The black matrixes 450 are included in concave shapes formed in the ND film 440, thereby reducing reflection of light that may be caused by reflection by the TFTs 425 and metal wires.

The black matrixes 450 may be respectively formed corresponding to the second regions 442. In this case, the transmitting of internal light in the light-emitting region may not be interrupted and the reflection of external light in the non-light emitting region may be effectively reduced or prevented.

The black matrixes 450 may be formed by patterning in the second regions 442. In this case, a separate process of attaching the black matrixes 450 to a panel of the organic light-emitting display device is not required. When the black matrixes 450 are formed by patterning in the second regions 442, a possibility of contamination by outgassing in the material of the black matrix 450 decreases, degradation of the TFT layer 420 caused by a high-temperature process is reduced or prevented, and defects, such as crystallization of $SiO_2$ due to a thickness gap of the black matrix 450, are reduced or prevented.

For example, the black matrixes 450 may be formed to fill concave shapes formed by performing a patterning process of a black matrix on the second regions 442.

The black matrix 450 may have a thickness in the range of about 100 to about 200 μm. In one embodiment, when the thickness of the black matrix 450 is within this range, reflection of light is effectively prevented, outgassing is decreased, and defects caused by a thickness gap of black matrix 450 are prevented.

The black matrix 450 may include an organic material. The black matrix 450 is formed in each of the second regions 442 corresponding to TFTs and wire regions, and thus may be formed of a material having a low reflectance. For example, the black matrix 450 may be formed of an organic material such as carbon black.

The ND film 440 including the black matrixes 450 may have a structure in which the first regions 441 and the second regions 442 are arranged alternately with respect to each other. The first regions 441 respectively correspond to the plurality of pixels 430, and the second regions 442 respectively correspond to the plurality of TFTs 425/metal wires.

Figure 6:
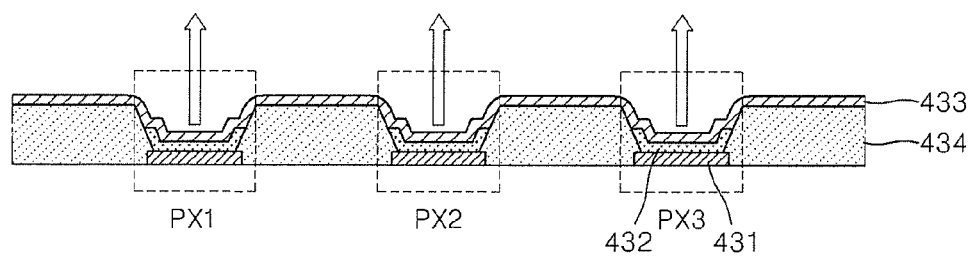
FIG. 6 is a cross-sectional view particularly illustrating a pixel unit of FIG. 5, according to an embodiment.

FIG. 6 is a cross-sectional view particularly illustrating a pixel unit of FIG. 5, according to an embodiment.

Referring to FIG. 6, each of a plurality of pixels PX1, PX2, and PX3 includes a first electrode 431, a second electrode 433, and an organic emission layer 432 interposed between the first electrode 431 and the second electrode 433. A pixel defining layer 434 may be formed between a plurality of pixels PX1, PX2, and PX3 to cover edges of the first electrode 431 and to define pixels each including the organic emission layer 432 formed in an opening formed on the first electrode 431.

Referring to FIGS. 5 and 6, in the top-emission type organic light-emitting display device 400, light emitted from the organic emission layer 432 is transmitted through the second electrodes 433, the encapsulation substrate 490, and the ND film 440, whereby images are displayed on the side of the encapsulation substrate 490.

Figure 7:
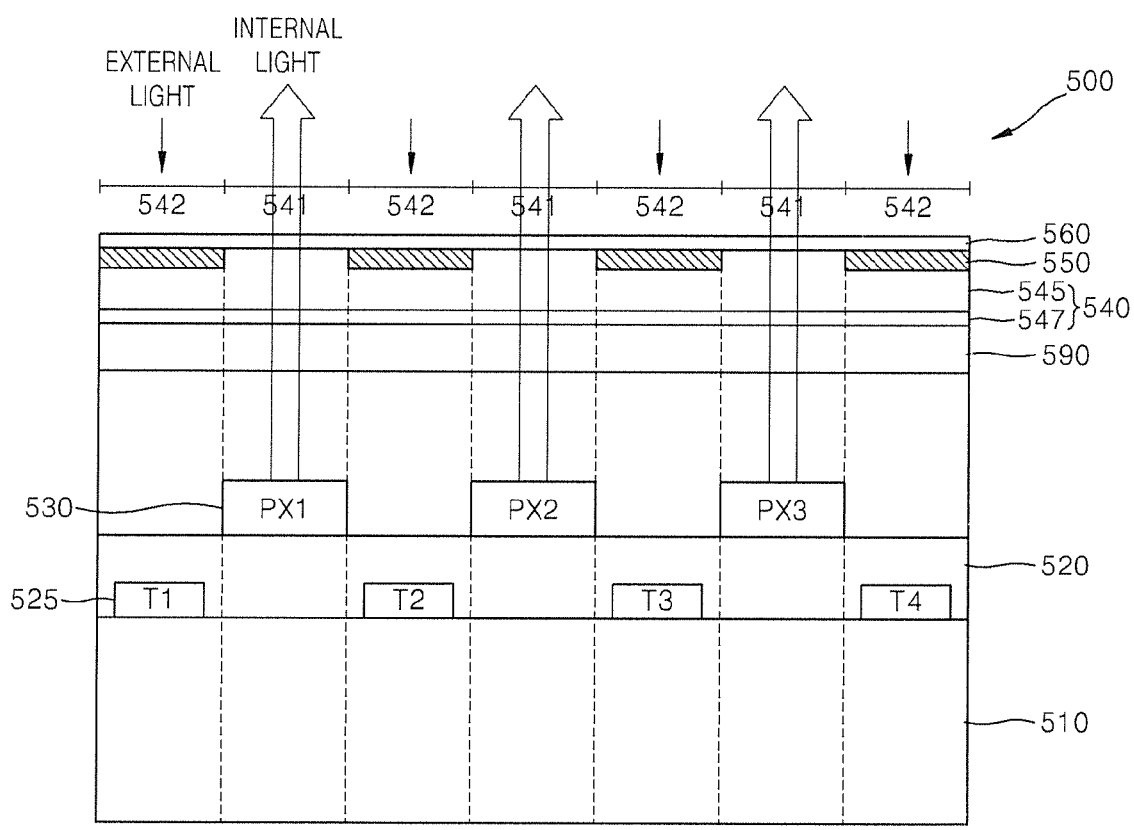
FIG. 7 is a schematic cross-sectional view illustrating a top-emission type organic light-emitting display device according to another embodiment.

FIG. 7 is a schematic cross-sectional view illustrating a top-emission type organic light-emitting display device 500 according to another embodiment.

Referring to FIG. 7, the organic light-emitting display device 500 includes a substrate 510, a TFT layer 520 including a plurality of TFTs 525, a plurality of pixels 530, an encapsulation substrate 590, an ND film 540 including black matrixes 550, and a surface treatment layer 560.

The substrate 510 may be formed of various suitable materials such as glass and/or plastic. The organic light-emitting display device 500 is a top-emission type, and thus the substrate 510 may not necessarily be transparent.

The TFT layer 520 includes the plurality of TFTs 525. The plurality of TFTs 525 may be respectively connected electrically to the plurality of pixels 530, and the element of the TFT layer 520 is not limited to the above example. The plurality of pixels 530 is formed on the TFT layer 520.

The encapsulation substrate 590 may be formed on the plurality of pixels 530 to protect the pixels 530. The encapsulation substrate 590 is closely attached to the substrate 510 to protect the plurality of pixels 530 and a driving circuit (DC) unit. The encapsulation substrate 590 is formed apart from the plurality of pixels 530.

The ND film 540 including the black matrixes 550 is formed on a side of the encapsulation substrate 590. The ND film 540 is disposed in a direction in which internal light emitted from the plurality of pixels 530 is emitted. In the present embodiment, the organic light-emitting display device 500 is a top-emission type, and thus the ND film 540 may be disposed in the opposite direction of the substrate 510. For example, the ND film 540 may be disposed on the encapsulation substrate 590. The ND film 540 includes first regions 541 (light-emitting region) corresponding to the plurality of pixels 530 from which internal light is emitted, and second regions 542 (non-light emitting region) each including the black matrix 550. The second regions 542 may be formed respectively corresponding to the TFTs 525 and metal wires.

The ND film 540 includes a base resin layer 545 and a dye-containing layer 547. A material for forming the base resin layer 545 is the same as the material of the base resin layer 145 as described above. The dye-containing layer 547 includes a binder and a dye. In particular, the dye adjusts the transmittance of the first region 541 corresponding to the light-emitting region. The amount of the dye mixed with the binder may be in the range of about 10 to about 50 parts by weight based on 1 part by weight of the binder. In one embodiment, when the amount of the dye is within this range, the first region 541 has a satisfactory transmittance.

The black matrixes 550 are included in concave shapes formed in the ND film 540, thereby reducing reflection of light that may be caused by reflection by the TFTs 525 and metal wires. A black matrix has a very low reflectance, and thus, when the non-light emitting region includes such a black matrix, the reflectance by the TFTs 525 and metal wires may be about 5%.

The black matrixes 550 may be respectively formed corresponding to the second regions 542. In this case, the transmitting of internal light in the light-emitting region may not be interrupted and the reflection of external light in the non-light emitting region may be effectively reduced or prevented.

The black matrixes 550 may be formed by patterning in the second regions 542. In this case, a separate process of attaching the black matrixes 550 to a panel of the organic light-emitting display device is not required. When the black matrixes 550 are formed by patterning in the second regions 542, a possibility of contamination by outgassing in the material of the black matrix 550 decreases, degradation of the TFT layer 520 caused by a high-temperature process is reduced or prevented, and defects, such as crystallization of $SiO_2$ due to a thickness gap of the black matrix 550, are reduced or prevented.

For example, the black matrixes 550 may be formed to fill concave shapes formed by performing a patterning process of a black matrix on the second regions 542.

The black matrix 550 may have a thickness in the range of about 100 to about 200 µm. In one embodiment, when the thickness of the black matrix 550 is within this range, reflection of light is effectively prevented, outgassing is decreased, and defects caused by a thickness gap of black matrix 550 are prevented.

The black matrix 550 may include an organic material. Since the black matrixes 550 are formed in the second regions 542 corresponding to TFTs and wire regions, the black matrix 550 may be formed of a material having a low reflectance. A material for forming the black matrix 550 may be an organic material such as carbon black. Examples of the organic material include carbon black, a dye, and a resin.

The ND film 540 including the black matrixes 550 may have a structure in which the first regions 541 and the second regions 542 are arranged alternately with respect to each other. The first regions 541 respectively correspond to the plurality of pixels 530, and the second regions 542 respectively correspond to the plurality of TFTs 525/metal wires.

The surface treatment layer 560 is formed by surface-treating the ND film 540 to reduce or prevent reflection of light. Examples of the surface treatment include AR coating and AG coating.

Figure 8:
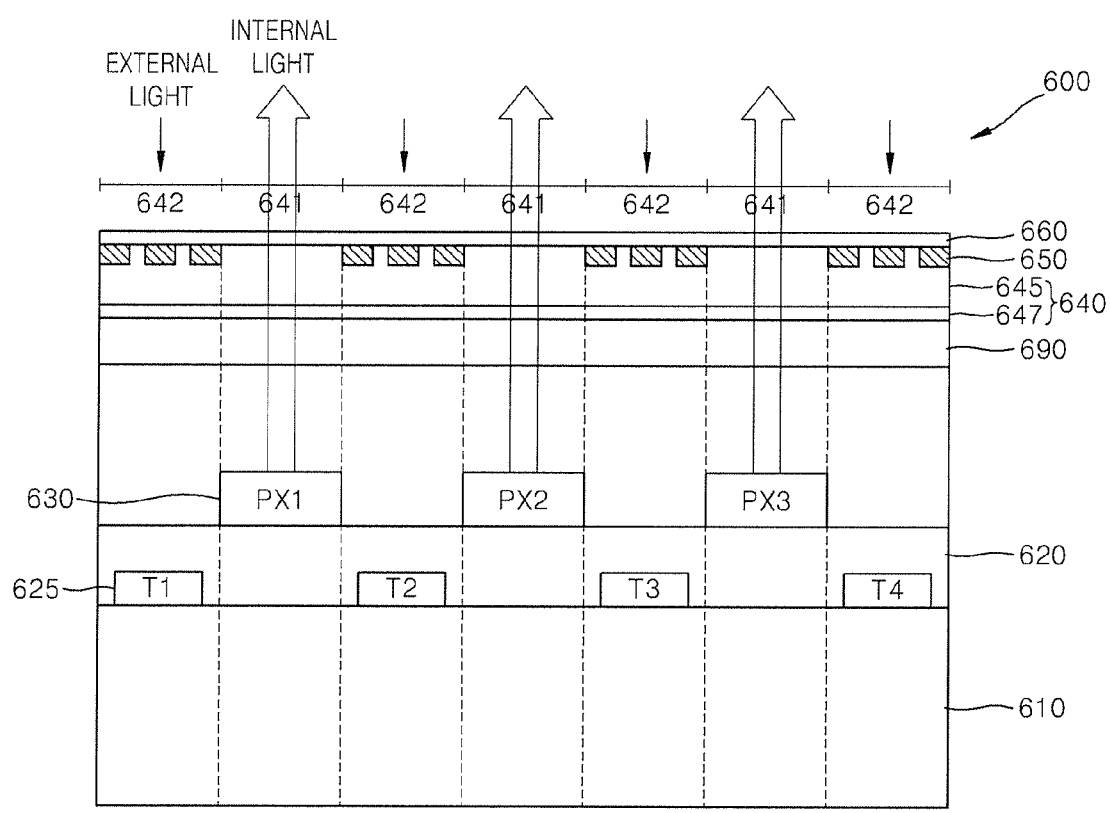
FIG. 8 is a schematic cross-sectional view illustrating a top-emission type organic light-emitting display device according to another embodiment.

FIG. 8 is a schematic cross-sectional view illustrating a top-emission type organic light-emitting display device 600 according to another embodiment.

Referring to FIG. 8, the organic light-emitting display device 600 includes a substrate 610, a TFT layer 620 including a plurality of TFTs 625, a plurality of pixels 630, an encapsulation substrate 690, an ND film 640 including black matrixes 650, and a surface treatment layer 660.

In the present embodiment, the black matrix 650 may be sub-divided and formed in each of a plurality of second regions 642. The black matrix 650 may also be formed in each of the second regions 642 in a single whole form.

A patterning process is performed on the second regions 642 of the ND film 640, and concave shapes formed on the second regions 642 are filled with the black matrixes 650. Through this process, the ND film 640 including the black matrixes 650 may be formed. The ND film 640 including the black matrixes 650 includes the first regions 641 each including a base resin layer 645 and a dye-containing layer 647, and the second regions 642 each including the base resin layer 645 including the black matrixes 650 and the dye-containing layer 647. In the first regions 641, the transmittance of the light-emitting region may be satisfactorily adjusted by adjusting the amount of the dye in the dye-containing layer 647. In the second regions 642, the reflectance of the non-light emitting region may be adjusted to a low level by using the black matrixes 650.

Figure 9:
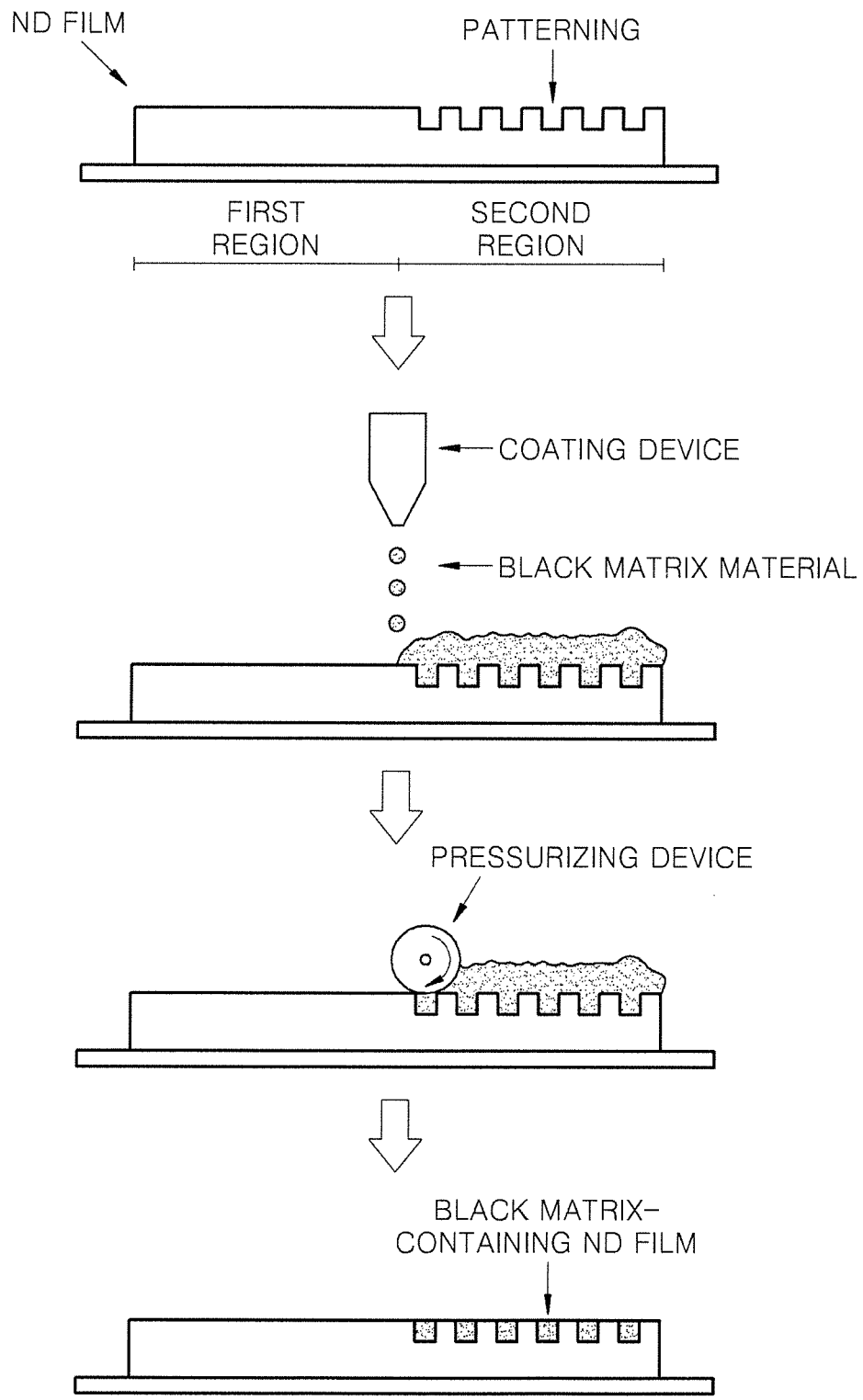
FIG. 9 is a diagram illustrating a method of preparing a black matrix-containing neutral density (ND) film according to an embodiment.

FIG. 9 is a diagram illustrating a method of preparing a black matrix-containing ND film according to an embodiment.

Referring to FIG. 9, an ND film includes a base resin layer and a dye-containing layer, and a first region is a light-emitting region corresponding to a pixel and a second region is a non-light emitting region corresponding to a TFT/metal wire.

First, a patterning process for forming a black matrix is performed on the second region to prepare an ND film with a pattern formed therein. The pattern may have a concave shape; however, the shape of the pattern is not limited thereto.

Subsequently, a material for forming a black matrix is coated in the second region of the ND film with a pattern formed therein. For example, concave shapes formed in the second region of the ND film may be filled with a material for forming a black matrix by using a coating device.

Lastly, the second region filled with the material for forming a black matrix is planarized using a pressurizing device; however, the device used to planarize the second region is not limited thereto.

According to the above embodiments of the present invention, an organic light-emitting display device has high external luminous efficiency, high contrast, and enhanced visibility by suppressing reflection of external light incident from outside and reducing or minimizing loss of light emitted outside from an organic light-emitting diode. In the organic light-emitting display device, the light emitted outside from an organic light-emitting diode is non-polarized light, and thus 3D images may be viewed clearly.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a substrate;
a plurality of pixels each comprising a first electrode, a second electrode, and an organic emission layer between the first electrode and the second electrode;
a black matrix-containing neutral density (ND) film arranged in a direction in which light is emitted from the plurality of pixels and comprising a plurality of first regions respectively corresponding to the plurality of pixels and a plurality of second regions,
and a dye-containing layer comprising a first portion and a second portion, the dye-containing layer being a single continuous layer having planar bottom and top surfaces, wherein each of the plurality of second regions comprises a black matrix and the first portion of the dye-containing layer, the black matrix overlaps the first portion of the dye-containing layer in a direction normal to the substrate, wherein each of the plurality of first regions comprises a first portion of a base resin layer, a first portion of a surface treatment layer and the second portion of the dye-containing layer, and wherein the base resin layer separates the dye-containing layer from the black matrix in each of the plurality of second regions, and the first portion of the surface treatment layer directly contacts the first portion of the base resin layer in each of the plurality of the first regions.

2. The organic light-emitting display device of claim 1, wherein the black matrix corresponds to each of the plurality of second regions.

3. The organic light-emitting display device of claim 1, wherein the black matrix is patterned in each of the plurality of second regions.

4. The organic light-emitting display device of claim 1, wherein a concave shape in each of the plurality of second regions is filled with the black matrix.

5. The organic light-emitting display device of claim 1, wherein the black matrix has a thickness of about 100 μm to about 200 μm.

6. The organic light-emitting display device of claim 1, wherein the black matrix comprises an organic material.

7. The organic light-emitting display device of claim 1, wherein the black matrix comprises carbon black, a dye, or a resin.

8. The organic light-emitting display device of claim 1, wherein each of the plurality of second regions is a non-light emitting region corresponding to a thin film transistor (TFT) and a metal wire.

9. The organic light-emitting display device of claim 1, wherein each of the plurality of first regions and each of the plurality of second regions of the black matrix-containing ND film are arranged alternately with respect to each other.

10. The organic light-emitting display device of claim 1, wherein the organic light-emitting display device is a bottom-emission type in which light emitted from the plurality of pixels is emitted towards the substrate.

11. The organic light-emitting display device of claim 1, wherein the organic light-emitting display device is a top-emission type in which light emitted from the plurality of pixels is emitted in an opposite direction of the substrate.

12. The organic light-emitting display device of claim 1, wherein the first regions transmit light of a certain color emitted from the plurality of pixels and have an optical transmittance of from about 30% to about 70%.

13. The organic light-emitting display device of claim 1, wherein the second regions have an optical transmittance of from about 1% to about 10%.

14. The organic light-emitting display device of claim 1, wherein the black matrix-containing ND film comprises at least one selected from the group consisting of polycarbonate (PC), polyethylene terephthalate (PET), amorphous polyethylene terephthalate (APET), polypropylene terephthalate (PPT), polynaphthalene terephthalate (PEN), polyethylene terephthalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polymethyl methacrylate (PMMA), polyimide (PI), polyarylate (PAR), polyethersulfone (PES), polyetherimide (PEI), a silicon resin, a fluorine resin, and an epoxy resin.

15. The organic light-emitting display device of claim 1, wherein the black matrix-containing ND film comprises from about 10 parts to about 50 parts by weight of a dye based on 1 part by weight of a binder.

16. The organic light-emitting display device of claim 1, further comprising the surface treatment layer formed by performing an anti-reflector (AR) coating treatment.

17. The organic light-emitting display device of claim 1, wherein each of the plurality of second regions further comprises a second portion of the surface treatment layer and a second portion of the base resin layer.

* * * * *